(12) United States Patent
Chi

(10) Patent No.: US 9,607,718 B2
(45) Date of Patent: Mar. 28, 2017

(54) SEMICONDUCTOR MEMORY DEVICE AND TEST OPERATION METHOD THEREOF

(71) Applicant: SK hynix Inc., Gyeonggi-do (KR)

(72) Inventor: Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/928,446

(22) Filed: Oct. 30, 2015

(65) Prior Publication Data

US 2016/0351277 A1    Dec. 1, 2016

(30) Foreign Application Priority Data

May 26, 2015    (KR) .......................... 10-2015-0073037

(51) Int. Cl.
| | |
|---|---|
| *G11C 29/00* | (2006.01) |
| *G11C 29/08* | (2006.01) |
| *G11C 17/16* | (2006.01) |
| *G11C 29/24* | (2006.01) |
| *G11C 17/18* | (2006.01) |
| *G11C 29/44* | (2006.01) |

(52) U.S. Cl.
CPC .............. *G11C 29/78* (2013.01); *G11C 17/16* (2013.01); *G11C 29/08* (2013.01); *G11C 29/24* (2013.01); *G11C 17/18* (2013.01); *G11C 2029/4402* (2013.01)

(58) Field of Classification Search
CPC .......... G11C 29/24; G11C 29/78; G11C 29/44
See application file for complete search history.

(56) References Cited

U.S. PATENT DOCUMENTS

| | | | | |
|---|---|---|---|---|
| 5,293,386 A | * | 3/1994 | Muhmenthaler ...... | G11C 29/44 365/201 |
| 5,327,382 A | * | 7/1994 | Seno ...................... | G11C 29/24 365/200 |
| 5,548,557 A | * | 8/1996 | Futatsuya .............. | G11C 16/08 365/185.09 |
| 5,631,868 A | | 5/1997 | Termullo, Jr. et al. | |
| 5,652,725 A | * | 7/1997 | Suma ..................... | G11C 29/24 365/200 |
| 2002/0080657 A1 | * | 6/2002 | Mine ...................... | G11C 11/406 365/200 |
| 2002/0114198 A1 | * | 8/2002 | Kato ...................... | G11C 29/26 365/200 |
| 2011/0267908 A1 | * | 11/2011 | Kim ...................... | G11C 29/785 365/200 |
| 2016/0005496 A1 | * | 1/2016 | Kim ........................ | G11C 29/78 365/96 |

\* cited by examiner

*Primary Examiner* — Tuan T Nguyen
(74) *Attorney, Agent, or Firm* — IP & T Group LLP

(57) ABSTRACT

A semiconductor memory device includes: a word line driving unit suitable for performing activation operations for a plurality of normal word lines and a plurality of redundancy word lines in response to test addresses; and a test control unit suitable for controlling a number of activations of each of the plural normal and redundancy word lines to be equal based on repair information corresponding to a repair target word line among the plural normal word lines during a test operation.

15 Claims, 4 Drawing Sheets

SEMICONDUCTOR MEMORY DEVICE AND TEST OPERATION METHOD THEREOF

CROSS-REFERENCE TO RELATED APPLICATIONS

The present application claims priority of Korean Patent Application No. 10-2015-0073037, filed on May 26, 2015, which is incorporated herein by reference in its entirety.

BACKGROUND

1. Field

Exemplary embodiments of the present invention relate to a semiconductor design technology, and more particularly, to a semiconductor memory device including redundancy memory cells.

2. Description of the Related Art

In general, semiconductor memory devices such as Double Data Rate Synchronous DRAM (DDR SDRAM) include a large number of memory cells. As semiconductor memory devices become more highly integrated, the number of memory cells further increases. When a defect occurs in one of the memory cells, the semiconductor memory device cannot perform as intended and must therefore be discarded, which hurts product yield. To avoid this problem, semiconductor memory devices have redundancy memory cells in addition to normal memory cells.

Redundancy memory cells substitute for defective memory cells (hereafter, a 'repair-target memory cell'). More specifically, when accessing the repair-target memory cell during a read/write operation, the redundancy memory cell is accessed instead of the repair-target memory cell. Thus, when an address corresponding to the repair-target memory cell is input, the semiconductor memory device accesses the redundancy memory cell instead of the repair-target memory cell, a process known as a 'repair operation'. Through repair operations, semiconductor memory devices can continue to operate even with defective memory cells.

In addition to redundancy memory cells, additional circuits such as a repair fuse circuit are required to perform repair operations. Repair fuse circuits store addresses of repair-target memory cells (hereafter, referred to as 'repair target address'), and include a multiple fuses. Each of the fuses is programmed with a repair target address. The programming includes a series of operations for storing state information in the fuse. For example, programming may include storing a repair target address in the fuse. Through the fuse programming, access to the repair-target memory cell is routed to the redundancy memory cell.

There are two methods for programming state information in fuses, a physical method and an electrical method.

The physical method programs the fuses using a laser beam to physically cut the fuses. Fuses for the physical method are referred to as physical type fuses. Since the electrical connection of the fuse is cut using a laser beam, they are also referred to as laser blown fuses. Because of their nature, physical type fuses can only be programmed in the wafer state and it is too late once they have been packed.

The electrical method programs state information by rupturing fuses (known as "electrical type fuses") using a high voltage. Electrical fuses can be classified into anti-type fuses and blowing type fuses. Anti-type fuses go from an open state to a short state, and blowing type fuses go from a short state to an open state. Programming can be performed on electrical type fuses in both the package state and the wafer state, unlike physical type fuses. Semiconductor memory devices go through many test operations before they are commercialized. Only semiconductor memory devices having passed through all of the test operations are sold to consumers. The purpose of the testing operations to ensure the devices operate properly. Test operations are performed at every step of the fabrication process so that costs are not incurred by further processing of defective products.

Test operations for normal memory cells and redundancy memory cells will now be briefly described.

First, during a test operation, test data are stored in normal memory cells and redundancy memory cells, and the test data is read out to determine whether the normal and redundancy memory cells are working properly. Output of data will now be described. The normal word lines, each coupled to normal memory cells, are sequentially activated in response to test addresses which are sequentially enabled, and word lines coupled to redundancy memory cells are also sequentially activated in response to the test addresses which are sequentially enabled. The activation of the normal and redundancy word lines indicates that test data stored in memory cells coupled to an activated word line can be outputted to the outside. The outputted test data is analyzed to detect the repair target memory cells. Then, the repair target address corresponding to the detected repair target memory cells is programmed into the fuses. The programmed target address, that is, repair information, is provided to the proper circuit during a normal operation or test operation.

SUMMARY

Various embodiments are directed to a semiconductor memory device capable of performing a test operation on normal word lines and redundancy word lines using repair information.

In accordance with an embodiment of the present invention, a semiconductor memory device may include: a word line driving unit suitable for performing activation operations for a plurality of normal word lines and a plurality of redundancy word lines in response to test addresses; and a test control unit suitable for controlling a number of activations of each of the plural normal and redundancy word lines to be equal based on repair information corresponding to a repair target word line among the plural normal word lines during a test operation.

The test control unit may restrict enablement of a test address corresponding to the repair information among the test addresses.

The semiconductor memory device may further include: a plurality of normal memory cells coupled to the plural normal word lines; and a plurality of redundancy memory cells coupled to the plural redundancy word lines, wherein, during the test operation, the plural normal and redundancy memory cells excluding a memory cell corresponding to the repair target word line are enabled an equal number of times.

In accordance with another embodiment of the present invention, a semiconductor memory device may include: an address generation unit suitable for generating test addresses corresponding to a plurality of normal word lines and a plurality of redundancy word lines during a test operation; a word line driving unit suitable for performing activation operations for the plural normal and redundancy word lines in response to the test addresses; a fuse unit suitable for storing repair information; and an enablement control unit suitable for controlling enablement of an activation signal corresponding to the repair information.

The repair information may include a repair target address, and the semiconductor memory device may further include a repair information comparison unit suitable for comparing the repair target address to the test addresses corresponding to the plural normal word lines.

The enablement control unit may restrict enablement of the activation signal corresponding to a corresponding normal word line among the plural normal word lines in response to an output signal of the repair information comparison unit.

The repair information may include fuse enablement information representing whether a repair target address is programmed, and the semiconductor memory device may further include a repair information detection unit suitable for detecting the fuse enablement information from the repair information.

The enablement control unit may restrict enablement of the activation signal corresponding to a corresponding redundancy word line among the plural redundancy word lines in response to an output signal of the repair information detection unit.

In accordance with yet another embodiment of the present invention, a test operation method of a semiconductor memory device having plural normal and redundancy word lines, may include: programming repair information corresponding to a repair target address; and restricting activation operations for the plural normal and redundancy word lines based on the repair information.

The programming may be performed during a first test operation and the restricting is performed during a second test operation, and wherein the first and second test operations may sequentially activate the plural normal and redundancy word lines, and detect a defective memory cell coupled to the plural normal word lines.

The restricting of the activation operations may include enabling test addresses corresponding to the plural normal' and redundancy word lines based on the repair information.

The restricting of the activation operations may include restricting enablement of activation signals corresponding to the plural normal and redundancy word lines based on the repair information.

The repair information may include the repair target address, and the restricting of the activation operations may include: comparing the repair target address to test addresses corresponding to the plural normal word lines; and restricting enablement of the activation signal corresponding to a corresponding normal word line among the plural normal word lines in response to the result of the comparing of the repair target address to the test addresses.

The repair information may include fuse enablement information representing whether the repair target address is programmed, and the restricting of the activation operations may include: detecting the fuse enablement information from the repair information; and restricting enablement of the activation signal corresponding to a corresponding redundancy word line among the plural redundancy word lines in response to the result of the detecting of the information.

The programming of the repair information may include programming a repair target address detected from the plural normal word lines to a fuse corresponding to a corresponding redundancy word line among the plural redundancy word lines.

The semiconductor memory device in accordance with the embodiment of the present invention can control the number of activations per line in the normal word lines and the redundancy word lines using repair information during a test operation.

DETAILED DESCRIPTION

Figure 1:
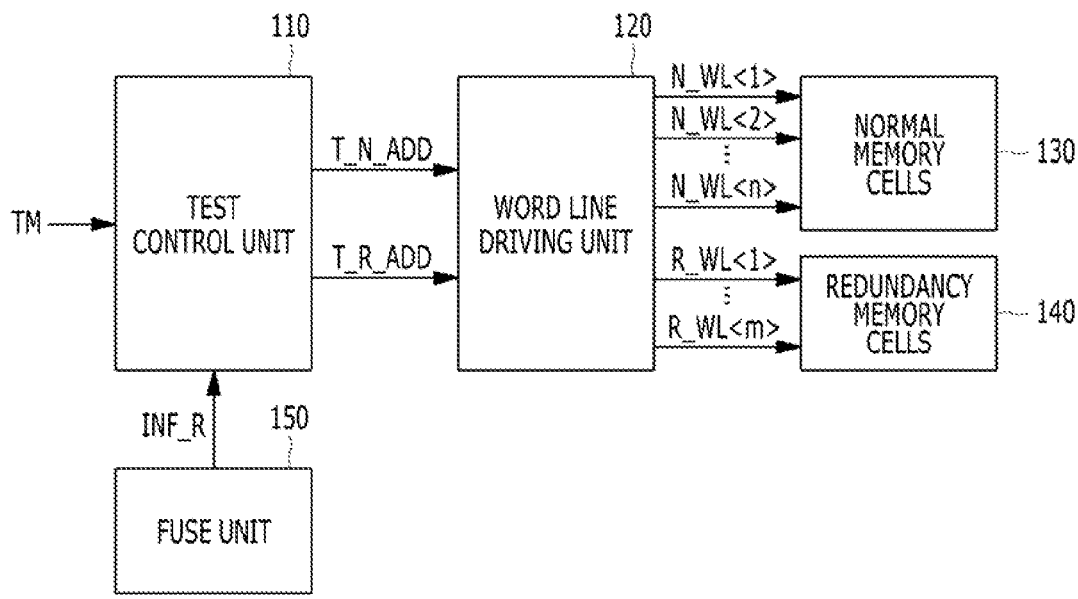
FIG. 1 is a block diagram illustrating a semiconductor memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor memory device in accordance with an embodiment of the present invention.

Referring to FIG. 1, the semiconductor memory device may include a test control unit 110, a word line driving unit 120, a plurality of normal memory cells 130, a plurality of redundancy memory cells 140, and a fuse unit 150.

The test control unit 110 may generate normal test addresses T_N_ADD and redundancy test addresses TR_R_DD in response to a test signal TM which is enabled during a test operation. At this time, the test control unit 110 may receive repair information INF_R, and restrict enablement of the normal test addresses T_N_ADD and the redundancy test addresses T_R_ADD according to the repair information INF_R. The test control unit 110 can control a number of activations of each norm word line N_WL<1:n> and each redundancy word line R_WL<1:m> through the restriction operation. For example, n may be greater than m.

The word line driving unit 120 may perform activation operations to the plural normal word lines N_WL<1:n> and redundancy word lines R_WL<1:m> in response to the normal test addresses T_N_ADD and the redundancy test addresses T_R_ADD. The plural normal word lines N_WL<1:n> may be activated in response to the normal test addresses T_N_ADD, and the plural redundancy word lines R_WL<1:m> may be activated in response to the redundancy test addresses T_R_ADD.

The plural normal memory cells 130 may be coupled to the plural normal word lines N_WL<1:n>. When a normal word line is activated, a read/write operation for a normal memory cell coupled to the normal word line can be performed. The plural redundancy memory cells 140 may be coupled to the plural redundancy word lines R_WL<1:m>. When a redundancy word line is activated, a read/write operation for a redundancy memory cell coupled to the redundancy word line can be performed.

The fuse unit 150 may program a repair target address to a storage circuit therein. The fuse unit 150 may output the programmed repair target address as repair information INF_R to the test control unit 110.

Hereafter, a simple test operation of the semiconductor memory device in accordance with an embodiment of the present invention will be described as follows. The test operation may include a first test operation for detecting a repair target address and a second test operation performed after the repair target address is programmed.

During the first test operation, the normal test addresses T_N_ADD may be sequentially enabled. Thus, the plural normal word lines N_WL<1:n> may be sequentially activated. Then, as the redundancy test addresses T_R_ADD are sequentially enabled, the plural redundancy word lines R_WL<1:m> may be sequentially activated. As described above, the test data stored in the plural normal memory cells 130 and the plural redundancy memory cells 140 may be output and analyzed through the activation operations of the plural normal word lines N_WL<1:n> and redundancy word lines R_WL<1:m>. Through the analysis during the first test operation, some of the plural normal memory cells 130 may be detected as the repair target memory cells and the addresses of the detected repair target memory cells may be programmed to the fuse unit 150 through a repair operation.

During the second test operation, the test control unit 110 may sequentially enable the normal test addresses T_N_ADD. At this time, the test control unit 110 may restrict the activation operation for a normal test address corresponding to the repair information INF_R. That is, the test control unit 100 may disable the normal test address corresponding to the repair information INF_R. Thus, the test control unit 110 may skip the normal test address corresponding to the repair information INF_R, and sequentially enable the other normal test addresses T_N_ADD. Then, the test control unit 110 may sequentially enable the redundancy test addresses T_R_ADD. The normal test address corresponding to the repair information INF_R and thus subject to the restriction may correspond to the redundancy memory cell that is detected during the first test operation. The restriction may cause a single activation operation of each of the normal word lines N_WL<1:n> and redundancy word lines R_WL<1:m> during the second test operation.

The semiconductor memory device in accordance with the embodiment of the present invention can equally control the number of activations of the plural normal word lines N_WL<1:n> and redundancy word lines R_WL<1:m> based on the repair information INF_R.

Figure 2:
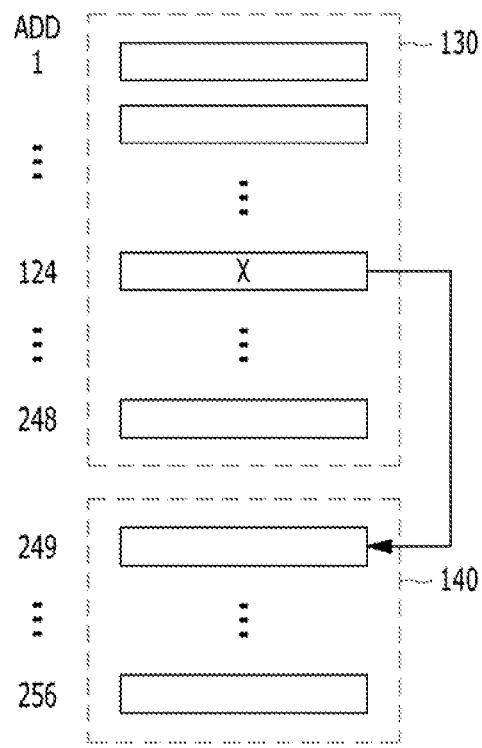
FIG. 2 is a diagram illustrating a test operation of the semiconductor memory device shown in FIG. 1.

FIG. 2 is a diagram illustrating the test operation of the semiconductor memory device.

FIG. 2 illustrates the plural normal memory cells 130, the plural redundancy memory cells 140, and addresses ADD corresponding to the respective word lines. Suppose that the plural normal memory cells 130 include 248 normal word lines, and the plural redundancy memory cells 140 include eight redundancy word lines. Furthermore, suppose that the repair operation is completed through the first test operation for a 124th address ADD. Through the repair operation, the 124th address ADD representing the defective normal memory cell or the repair-target memory cell may be programmed to get related with a 249th address representing the redundancy memory cell. In this case, when the 124th address ADD is enabled during a normal operation, a redundancy word line corresponding to the 249th address ADD may be activated. In this example, the repair information INF_RF may include the 124th address ADD as the repair target address.

Hereafter, referring to FIGS. 1 and 2, the second test operation of the semiconductor memory device in accordance with the embodiment of the present invention will be described.

During the second test operation, the normal test addresses T_N_ADD may be sequentially enabled from the first address ADD. Thus, the corresponding normal word lines may be sequentially activated. Then, when the 124th address ADD is enabled, the test control unit 110 may compare the repair information INF_R to the 124th address ADD, and disable the 124th address ADD. Thus, the normal word line corresponding to the 124th address ADD may not be activated. Then, the normal test addresses T_N_ADD from the 125th address ADD to the 248th address ADD may be enabled, and the corresponding normal word lines may be sequentially activated. Then, the redundancy test addresses T_R_ADD from the 249th address ADD to the 256th address ADD may be activated, and the corresponding redundancy word lines may be sequentially activated. As a result, all of the word lines excluding the normal word line corresponding to the 124th address ADD may be activated once during the second test operation.

During the second test operation, the semiconductor memory device in accordance with the embodiment of the present invention may perform the test operation by disabling an address corresponding to the repair information INF_R among the normal test addresses T_N_ADD and the redundancy test addresses T_R_ADD.

The semiconductor memory device in accordance with the embodiment of the present invention may control the activation operations for the plural normal word lines N_WL<1:n> and redundancy word lines R_WL<1:m> based on the repair information INF_R by controlling disablement of the normal test addresses T_N_ADD.

Figure 3:
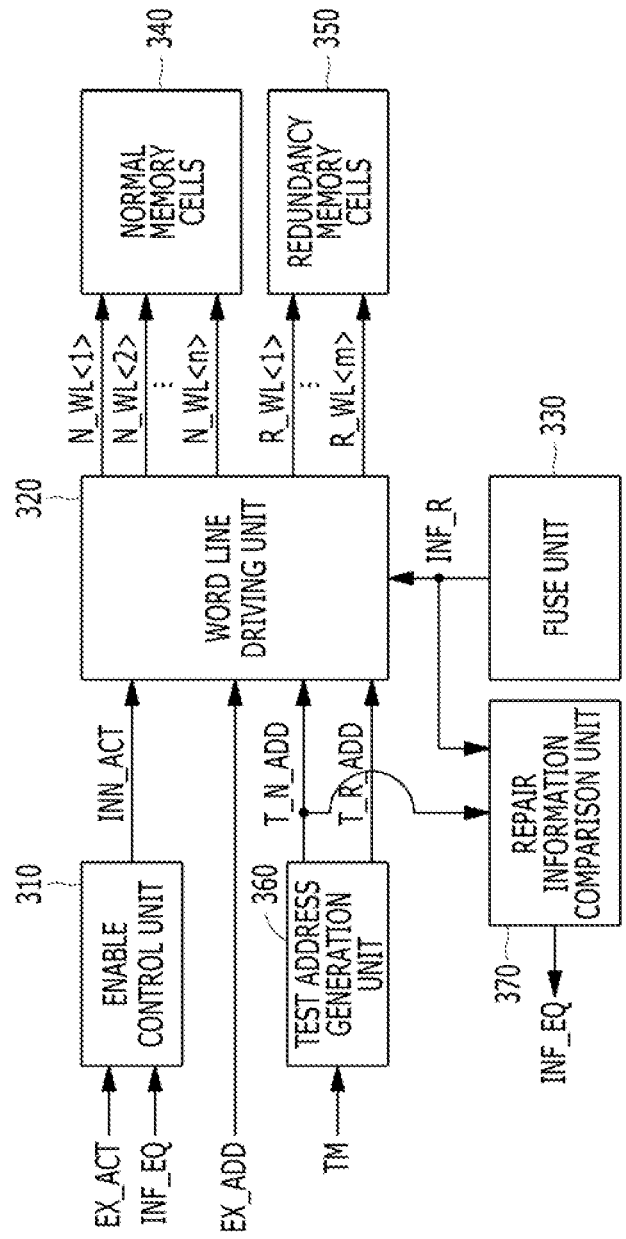
FIG. 3 is a block diagram illustrating a semiconductor memory device in accordance with another embodiment of the present invention.

FIG. 3 is a block diagram illustrating a semiconductor memory device in accordance with another embodiment of the present invention.

Referring to FIG. 3, the semiconductor memory device may include an enablement control unit 310, a word line driving unit 320, a fuse unit 330, a plurality of normal memory cells 340, a plurality of redundancy memory cells 350, a test address generation unit 360, and a repair information comparison unit 370.

The enablement control unit 310 may receive an external activation signal EX_ACT and generate an internal activation signal INN_ACT. During a test operation, the enablement control unit 310 can control enablement of the internal activation signal INN_ACT in response to comparison result information INF_EQ.

The word line driving unit 320 may activate a plurality of normal word lines N_WL<1:n> corresponding to the external address EX_ADD in response to the internal activation signal INN_ACT during a normal operation. When a repair target word line corresponding to the repair-target memory cell is detected in the plural normal word lines N_WL<1:n> the word line driving unit 320 may activate the corresponding redundancy word line among the plural redundancy word lines R_WL<1: m> according to the repair information INF_R through the repair operation described above. Furthermore, the word line driving unit 320 may activate the plural normal word lines N_WL<1:n> and redundancy word lines R_WL<1:m> corresponding to the normal test addresses T_N_ADD and the redundancy test addresses T_R_ADD, respectively, in response to the internal activation signal INN_ACT during a test operation.

The fuse unit 330 may program the repair target address to a storage circuit therein.

The plural normal memory cells 340 may be coupled to the plural normal word lines N_WL<1:n>, and the plural redundancy memory cells 350 may be coupled to the plural redundancy word lines R_WL<1:m>.

The test address generation unit 360 may generate test addresses during a test operation. More specifically, the test address generation unit 360 may sequentially generate normal test addresses T_N_ADD corresponding to the plural normal word lines N_WL<1:n> and redundancy test addresses T_R_ADD corresponding to the plural redundancy word lines R_WL<1:m> in response to a test signal TM which is enabled during the test operation.

The repair information comparison unit 370 may compare the normal test addresses T_N_ADD to the repair information INF_R, and generate comparison result information INF_EQ during the test operation. The word line driving unit 320 may compare the external address EX_ADD to the repair information INF_R for a repair operation during a normal operation.

Hereafter, a simple test operation of the semiconductor memory device in accordance with the embodiment of FIG. 3 will be described as follows. For convenience, the descriptions of the first test operation for detecting a repair target address are omitted, and the following descriptions will be focused on the second test operation.

During the second test operation, the test address generation unit 360 may sequentially enable the normal test addresses T_N_ADD, and the word line driving unit 320 may sequentially activate the plural normal word lines N_WL<1:n> corresponding to the normal test addresses T_N_ADD in response to the internal activation signal INN_ACT. At this time, the repair information comparison unit 370 may compare the normal test addresses T_N_ADD to the repair information INF_R and generate comparison result information INF_EQ. The comparison result information INF_EQ may be enabled when a normal test address T_N_ADD is equal to the repair information INF_R, that is, when the normal test address T_N_ADD is the repair target address. The enablement control unit 310 may receive the external activation signal EX_ACT and generate the internal activation signal INN_ACT. When the comparison result information INF_EQ is enabled, the enablement control unit 310 can restrict enablement of the internal activation signal INN_ACT. That is, when a normal test address T_N_ADD is the repair target address, the internal activation signal INN_ACT may be disabled. Thus, the word line driving unit 320 may not activate a redundancy word line corresponding to the repair target address. In other words, when the normal test address T_N_ADD is the repair target address during the test operation with the normal test address T_N_ADD, the corresponding redundancy word line may not be activated. During the test operation with the normal test address T_N_ADD, all of the normal word lines N_WL<1:n> may be activated except for the normal word line and the redundancy word line corresponding to the repair target address.

Then, the test address generation unit 360 may sequentially activate the redundancy test addresses T_R_ADD. Thus, the word line driving unit 320 may sequentially activate the plural redundancy word lines R_WL<1:m>. During the test operation with the redundancy test addresses T_R_ADD, all of redundancy word lines R_WL<1:m> may be activated.

Thus, the normal word lines excluding the normal word line corresponding to the repair target address among the plural normal word lines N_WL<1:n> may be activated once, and the plural redundancy word lines R_WL<1:m> may also be activated once. This may indicate that the plural normal word lines N_WL<1:n> and redundancy word lines R_WL<1:m> can be controlled to be activated once during the test operation.

The semiconductor memory device in accordance with the embodiment of the present invention may restrict enablement of the internal activation signal INN_ACT using the repair information INF_R corresponding to the repair target address, and thus equally control the number of activations of the plural normal word lines N_WL<1:n> and redundancy word lines R_WL<1:m>.

Figure 4:
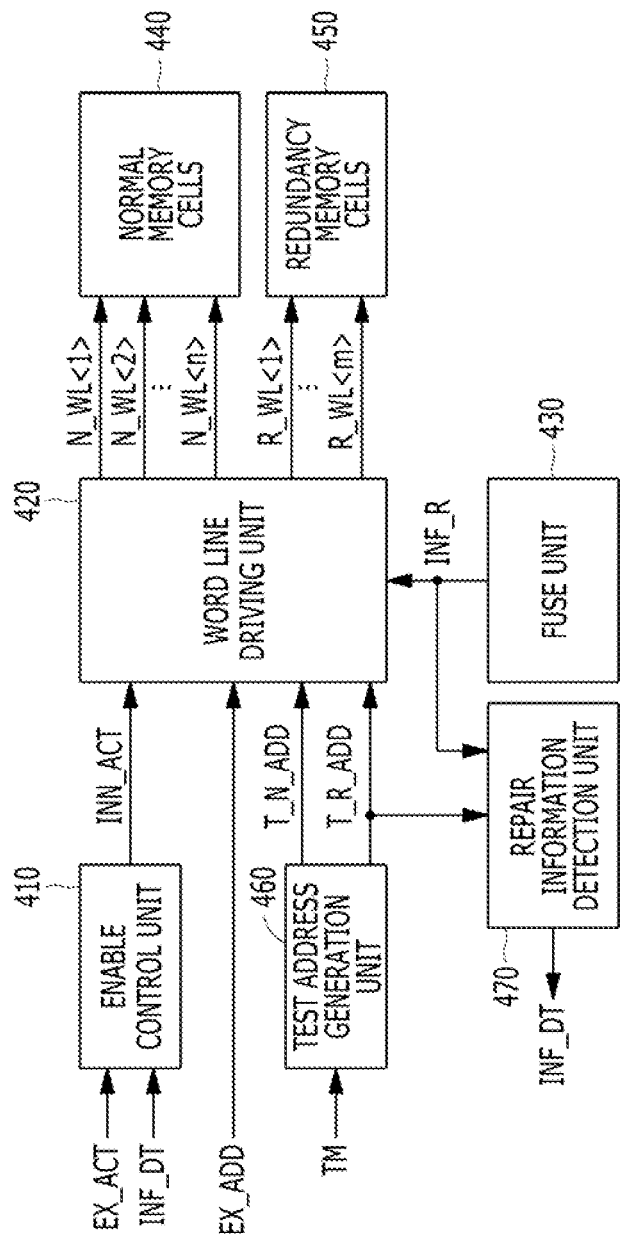
FIG. 4 is a block diagram illustrating a semiconductor memory device in accordance with another embodiment of the present invention.

FIG. 4 is a block diagram illustrating a semiconductor memory device in accordance with another embodiment of the present invention.

Referring to FIG. 4, the semiconductor memory device may include an enablement control unit 410, a word line driving unit 420, a fuse unit 430, a plurality of normal memory cells 440, a plurality of redundancy memory cells 450, a test address generation unit 460, and a repair information detection unit 470. The following descriptions will be focused on the enablement control unit 410, the fuse unit 430, and the repair information detection unit 470. The other elements shown in FIG. 4 may perform the same operation as corresponding elements described with reference to FIG. 3.

The fuse unit 430 may program the repair target address to a storage circuit therein. For reference, the fuse unit 430 may program fuse enablement information indicating whether the repair target address is programmed as well as the repair target address. The repair information INF_R may include the fuse enablement information as well as the programmed repair target address.

The repair information detection unit 470 may receive a redundancy address T_R_ADD and detect the fuse enablement information from the repair information INF_R during the test operation. The repair information detection unit 470 may output the detected fuse enablement information as detection information INF_DT to the enablement control unit 410.

Then, the enablement control unit 410 may control enablement of the activation signal INN_ACT in response to the detection information INF_DF during the test operation.

Hereafter, a simple test operation of the semiconductor memory device in accordance with the embodiment of FIG. 4 will be described as follows. For convenience, the descriptions of the first test operation for detecting repair information INF_R are omitted herein, and the following descriptions will be focused on the second test operation.

During the second test operation, the test address generation unit 460 may sequentially enable normal test addresses T_N_ADD. Thus, the word line driving unit 420 may sequentially activate the plural normal word lines N_WL<1:n>. At this time, when a normal test address T_N_ADD is the repair target address, the redundancy word line corresponding to the repair target address may be activated as during a normal operation. During the test operation with the normal test address T_N_ADD, all of the normal word lines N_WL<1:n> may be activated except for the normal word line corresponding to the repair target address. During the test operation with the normal test address T_N_ADD, the redundancy word line corresponding to the repair target address may be activated.

Then, the test address generation unit 460 may sequentially enable redundancy test addresses T_R_ADD. Thus, the word line driving unit 420 may sequentially activate the plural redundancy word lines R_WL<1:m>.

At this time, the repair information detection unit 470 may generate the detection information INF_DT in response to the redundancy test addresses T_R_ADD. The detection information INF_DT may be enabled according to the fuse enablement information included in the repair information INF_R. When the repair target address is programmed in the fuse unit 430 corresponding to a redundancy test address T_R_ADD, the detection information INF_DT may be enabled. As described above, the repair information INF_R may include the fuse enablement information as well as the repair target address, and the repair information detection unit 470 may output the detected fuse enablement information as the detection information INF_DT to the enablement control unit 410, which means that the detection information INF_DT represents the redundancy word line activated during the test operation with the normal word lines N_WL<1:n>.

The enablement control unit 410 may receive an external activation signal EX_ACT and generate an internal activation signal INN_ACT. When the detection information INF_DT is enabled, the enablement control unit 410 may restrict enablement of the internal activation signal INN_ACT. That is, since the repair target address is programmed, the internal activation signal INN_ACT for a redundancy word line, which has been already activated once during the test operation with the normal test addresses T_N_ADD, may not be enabled. Therefore, the word line driving unit 420 may not activate the redundancy word line corresponding to the detection information INF_DT. During the test operation with the redundancy test addresses T_R_ADD all of the redundancy word lines R_WL<1:m> may be activated except for the redundancy word line activated during the test operation with the normal test address T_N_ADD, which is represented by the detection information INF_DT.

Thus, the normal word lines excluding the normal word line corresponding to the repair target address among the plural normal word lines N_WL<1:n> may be activated once, and the plural redundancy word lines R_WL<1:m> may also be activated once. This may indicate that the plural normal word lines N_WL<1:n> and redundancy word lines R_WL<1:m> can be controlled to be activated once during the test operation.

The semiconductor memory device in accordance with the embodiment of the present invention may restrict enablement of the internal activation signal INN_ACT using the repair information INF_R corresponding to the fuse enablement information, and thus equally control the number of activations of the plural normal word lines N_WL<<1:n> and redundancy word lines R_WL<1:m>. This may indicate that the test operation can be more efficiently controlled.

Figure 5:
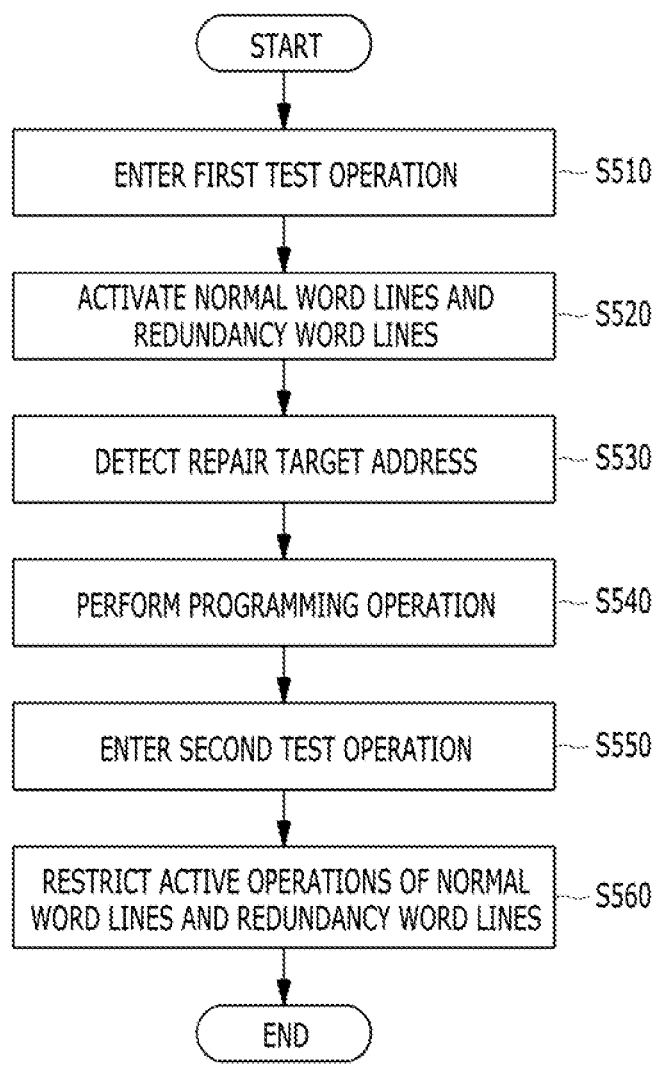
FIG. 5 is a flowchart illustrating an operation of the semiconductor memory device in accordance with the embodiment of the present invention.

FIG. 5 is a flowchart illustrating an operation of the semiconductor memory device in accordance with the embodiment of the present invention.

Referring to FIG. 5, at step S520, the plural normal word lines and the plural redundancy word lines may be activated. The plural normal word lines and the plural redundancy word lines may be sequentially activated.

At step S530, the repair target address may be detected. For example, the repair target address corresponding to one of the plural normal word lines is detected.

At step S540, a programming operation may be performed. The repair target address detected at step S530 may be programmed to a corresponding fuse. When the repair target address is detected from the plural normal word lines, the programming operation may be performed on a fuse corresponding to the corresponding redundancy word line.

At step S560 during the second test operation, activation operations of the plural normal word lines and the plural redundancy word lines may be restricted as described with reference to FIGS. 1 to 4.

The semiconductor memory device in accordance with the embodiment of the present invention may restrict the activation operations of the plural normal word lines and the plural redundancy word lines, and equally control the number of activations of each of the plural normal word lines and the plural redundancy word lines.

Accordingly, the semiconductor memory device can enable all of the memory cells excluding a repair target memory cell once during a test operation.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
   a word line driving unit suitable for performing activation operations for a plurality of normal word lines and a plurality of redundancy word lines in response to test addresses; and
   a test control unit suitable for controlling a number of activations of each of the plural normal and redundancy word lines to be equal based on repair information corresponding to a repair target word line among the plural normal word lines during a test operation.

2. The semiconductor memory device of claim 1, wherein the test control unit restricts enablement of a test address corresponding to the repair information among the test addresses.

3. The semiconductor memory device of claim 1, further comprising:
   a plurality of normal memory cells coupled to the plural normal word lines; and
   a plurality of redundancy memory cells coupled to the plural redundancy word lines,
   wherein, during the test operation, the plural normal and redundancy memory cells excluding a memory cell corresponding to the repair target word line are enabled an equal number of times.

4. A semiconductor memory device comprising:
   an address generation unit suitable for generating test addresses corresponding to a plurality of normal word lines and a plurality of redundancy word lines during a test operation;
   a word line driving unit suitable for performing activation operations for the plural normal and redundancy word lines in response to the test addresses; and
   an enablement control unit suitable for controlling enablement of an activation signal corresponding to repair information.

5. The semiconductor memory device of claim 4,
   wherein the repair information includes a repair target address, and
   further comprising a repair information comparison unit suitable for comparing the repair target address to the test addresses corresponding to the plural normal word lines.

6. The semiconductor memory device of claim 5, wherein the enablement control unit restricts enablement of the activation signal corresponding to a corresponding normal word line among the plural normal word lines in response to an output signal of the repair information comparison unit.

7. The semiconductor memory device of claim 4,
wherein the repair information includes fuse enablement information representing whether a repair target address is programmed, and
further comprising a repair information detection unit suitable for detecting the fuse enablement information from the repair information.

8. The semiconductor memory device of claim 7, wherein the enablement control unit restricts enablement of the activation signal corresponding to a corresponding redundancy word line among the plural redundancy word lines in response to an output signal of the repair information detection unit.

9. A test operation method of a semiconductor memory device having plural normal and redundancy word lines, the method comprising:
programming repair information corresponding to a repair target address; and
restricting activation operations for the plural normal and redundancy word lines based on the repair information.

10. The test operation method of claim 9,
wherein the programming is performed during a first test operation and the restricting is performed during a second test operation, and
wherein the first and second test operations sequentially activate the plural normal and redundancy word lines, and detect a defective memory cell coupled to the plural normal word lines.

11. The test operation method of claim 9, wherein the restricting of the activation operations comprises enabling test addresses corresponding to the plural normal and redundancy word lines based on the repair information.

12. The test operation method of claim 9, wherein the restricting of the activation operations comprises restricting enablement of activation signals corresponding to the plural normal and redundancy word lines based on the repair information.

13. The test operation method of claim 9,
wherein the repair information includes the repair target address, and
the restricting of the activation operations comprises:
comparing the repair target address to test addresses corresponding to the plural normal word lines; and
restricting enablement of the activation signal corresponding to a corresponding normal word line among the plural normal word lines in response to the result of the comparing of the repair target address to the test addresses.

14. The test operation method of claim 9,
wherein the repair information includes fuse enablement information representing whether the repair target address is programmed, and
the restricting of the activation operations comprises:
detecting the fuse enablement information from the repair information; and
restricting enablement of the activation signal corresponding to a corresponding redundancy word line among the plural redundancy word lines in response to the result of the detecting of the information.

15. The test operation method of claim 9, wherein the programming of the repair information comprises programming a repair target address detected from the plural normal word lines to a fuse corresponding to a corresponding redundancy word line among the plural redundancy word lines.

* * * * *